United States Patent [19]
Siegal et al.

[11] Patent Number: 5,851,955
[45] Date of Patent: Dec. 22, 1998

[54] EFFICIENT GROWTH OF HTS FILMS WITH VOLATILE ELEMENTS

[75] Inventors: Michael P. Siegal; Donald L. Overmyer; Frank Dominguez, all of Albuquerque, N. Mex.

[73] Assignee: Sandia Corporation, Albuquerque, N. Mex.

[21] Appl. No.: 886,243

[22] Filed: Jul. 1, 1997

[51] Int. Cl.$^6$ .............................. H01L 39/24; B05D 5/12

[52] U.S. Cl. .................... 505/120; 505/501; 505/742; 427/62

[58] Field of Search .................................. 505/120, 501, 505/742; 427/62

[56] References Cited

PUBLICATIONS

Pluym et al, IEEE on Applied Superconductivity, vol. 5, No. 2, Jun. 1995, pp. 1339–1342.
Schulz et al, IEEE on Applied Superconductivity, vol. 5, No. 2, Jun. 1995, pp. 1962–1965.

*Primary Examiner*—Roy V. King
*Attorney, Agent, or Firm*—George H. Libman

[57] ABSTRACT

A system for applying a volatile element-HTS layer, such as Tl-HTS, to a substrate in a multiple zone furnace, said method includes heating at higher temperature, in one zone of the furnace, a substrate and adjacent first source of Tl-HTS material, to sublimate Tl-oxide from the source to the substrate; and heating at lower temperature, in a separate zone of the furnace, a second source of Tl-oxide to replenish the first source of Tl-oxide from the second source.

11 Claims, 2 Drawing Sheets

Closed Furnace for Continuous Feed, 10

EFFICIENT GROWTH OF HTS FILMS WITH VOLATILE ELEMENTS

The United States Government has rights in this invention pursuant to Department of Energy Contract No. DE-AC04-94AL85000 with Sandia Corporation.

RELATED APPLICATIONS None.

BACKGROUND OF THE INVENTION

Volatile element-barium-calcium-copper-oxygen-based high-temperature superconductors, where the volatile element may be thallium (Tl-HTS), mercury (Hg-HTS), or other materials, have demonstrated several material phases with superconducting transition temperatures greater than 100° K. Tl-HTS materials have also demonstrated the lowest microwave surface resistance of any of the superconducting cuprates. Since such films are superconducting when cooled to temperatures well above the 77° K. temperature of liquid nitrogen, a readily available and relatively easily-handled coolant, they are desirable materials for the manufacture of many electronic components, as is well known to those skilled in the art.

These volatile element-HTS films and coatings are commonly grown in a two-step process. First, a non-superconducting precursor film is deposited on a substrate by any known process such as evaporation, sputtering, pulsed-laser deposition, chemical-vapor deposition, spin-coating, or screen printing. This precursor film is typically amorphous or nanocrystalline in nature. It may or may not contain the volatile element due to the volatile nature of these element's-oxide at the growth conditions which includes substrate temperature and oxygen partial pressure. Examples would be minimum temperatures of 750° C. at 1 atmosphere oxygen, with the minimum temperature decreasing as oxygen partial pressure decreases. The precursor film is then processed in a furnace to provide both a controlled source of oxide vapor pressure as well as the thermal energy required to form the HTS crystalline phases.

For example, the most common approach for Tl-HTS film growth is based upon the crucible method first reported by Ginley et al., Appl. Phys. Lett. 53, 406 (1988), and Ginley et al., Physics C, 156, 592 (1988). In this approach, a Tl-oxide-containing pellet or powder, such as a given composition of $Tl_vBa_wCa_xCu_yO_z$, is placed in a furnace in a metal, such as platinum or gold, or ceramic, such as alumina, crucible adjacent to a substrate coated with the precursor film. In operation, Tl-oxide sublimates from the pellet or powder at high temperature and, by a thermodynamic diffusion process, thallinates the precursor film to a given composition. The temperatures used to transport the Tl-oxide from the pellet or powder to the film (>700° C. in 1 atm oxygen) are sufficient to crystallize the films and grow Tl-HTS material. The precise value of this temperature depends on the Tl-HTS phase one is attempting to grow, and the oxygen partial pressure used in the furnace growth ambient.

The growth of Hg-HTS is similar to that described for thallium. In the description that follows, it is understood that if Hg is substituted for Tl, similar results are anticipated.

A problem with this crucible method is that Tl-oxide from the powder or pellet is used by the process and must be replenished for each run. This replacement requires many hours, as the furnace must be allowed to cool to allow access to the material, and then reheated for the next run. It also requires Tl-oxide, an environmentally hazardous material, to be handled for each run. Consequently, the crucible method is not considered to be an optimal process for safe and efficient commercial manufacture of Tl-HTS.

An alternative method is to use a two zone furnace, where a supply of Tl-oxide is provided at one zone and a substrate having a precursor layer is provided in the other zone. Such an approach provides independent control over each of the three main thermodynamic variables to Tl-HTS processing: substrate temperature, Tl-oxide partial pressure, and oxygen partial pressure. The process has been successfully demonstrated for the growth of Tl-HTS bulk powder samples by Aselage et al., J. Amer. Ceram. Soc., 73, 3345 (1990), for thick film samples by DeLuca et al., J. Mater. Res., 6, 1315 (1991), and for thin film samples by Siegal et al., IEEE Trans. on Supercond., 5, 1343, (1995) and by Pluym et al., IEEE Trans. on Supercond., 5, 1339, (1995). The techniques described in first three references worked with small diameter (<2 inch) research furnaces, but do not appear to work in larger furnaces capable of holding a standard 3 or 4 inch diameter wafer. The system of the fourth reference worked with a larger furnace, however, it required a baffle system surrounding the substrate to maintain adequate Tl-oxide partial pressure during growth. This baffle system severely limits the ability to rapidly insert and remove substrates to and from the furnace at high temperatures.

The inventors have proposed a simple model involving Tl-oxide vapor transport kinetics which explains why the smaller diameter two-zone furnaces seem to work, and the larger diameter furnaces do not work. The rate at which the Tl-oxide partial pressure builds at the substrate surface is partly dependent on the Tl-oxide source to film distance and on the total volume within the furnace that the vapor must expand in. As the furnace size is increased, both of these factors increase. In addition, the use of a pure Tl-oxide powder as the source requires a detailed knowledge of the equilibrium partial pressure, not just at the growth temperature, but at all temperatures below the growth temperature where the film material is still reactive. In other words, the Tl-oxide partial pressure must be controlled at the film surface during the rise time, hold time, and cooling time of the furnace anneal. Since a Tl-oxide partial pressure monitor that can survive the harsh environment of oxygen and Tl-oxide at high temperature does not exist, such control becomes increasingly difficult as the furnace size increases.

A further goal of the two-zone furnace approach has been to thallinate and grow Tl-HTS coatings on a long length of substrate (e.g. metal, flexible ceramic, etc.) that could act as a superconducting wire or tape with high current carrying capability. This goal has largely not been met, possibly due to the lack of control of the Tl-oxide partial pressure during the rise time, hold time, and cooling time of the furnace anneal.

SUMMARY OF THE INVENTION

It is an object of this invention to combine features of the two zone furnace method approach with the crucible approach to put a volatile element-HTS film or coating on a standard wafer.

It is another object of this invention to put a volatile element-HTS film or coating on a standard wafer-type substrate with a run time of less than two hours.

It is also an object of this invention to put a volatile element-HTS film or coating on a substrate without having to replenish the volatile element-oxide in the mixed powder source after each run.

It is also an object of this invention to put a volatile element-HTS film or coating on a long length of substrate material in a continuous feed manner to create a superconducting wire or tape.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise a method for applying a thallium high temperature superconductor layer to a substrate in a multiple zone furnace by heating at higher temperature, in one zone of the furnace, a substrate and adjacent first source of volatile element-HTS material, so the oxide sublimates from the source to the substrate, and heating at lower temperature, in a separate zone of the furnace, a second source of volatile element-oxide, so the oxide from the second source replenishes the volatile element in the first source.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

Figure 1:
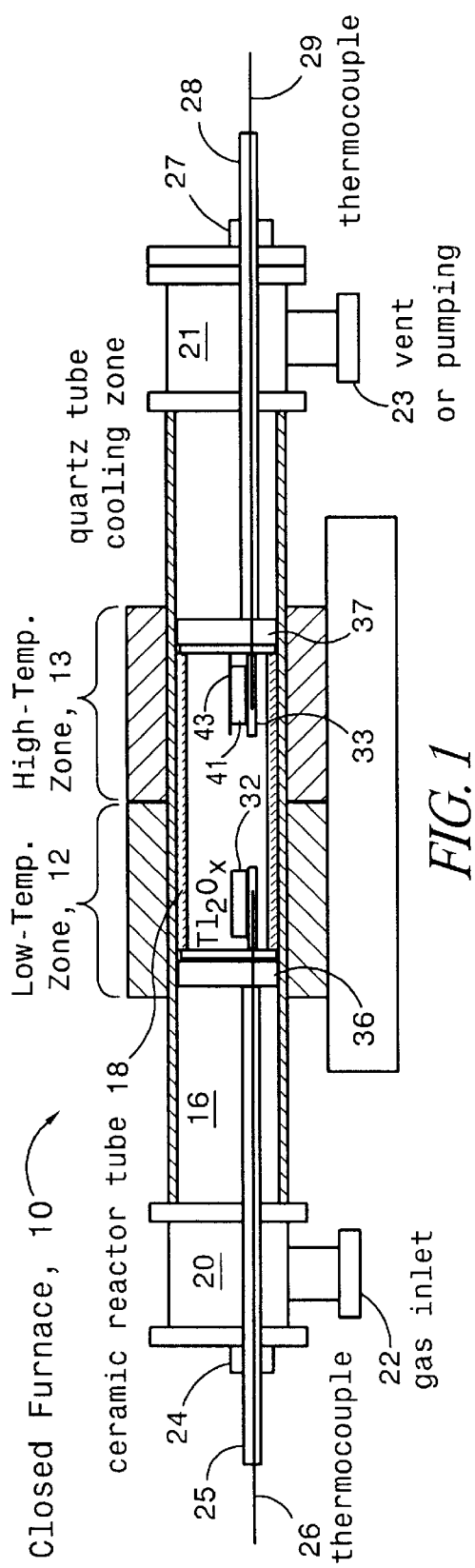
FIG. 1 shows a first embodiment of a two-zone closed furnace incorporating this invention.

In accordance with a first embodiment of the invention, as disclosed in FIG. 1, a conventional multiple-heat-zone furnace 10 is provided having a low temperature zone 12 and a high temperature zone 13. Furnace 10 may include a heating chamber defined as a hollow outer tube 16 and a concentric inner tube 18, both tubes extending through multiple heating coils (not shown) that provide controllable temperatures to create the two heating zones 12 and 13. Outer tube 16 provides physical protection for the chamber and may be made of a material such as quartz. Inner tube 18 protects tube 16 from the reactions within the furnace. Tube 18 has a diameter slightly smaller than that of tube 16 and is typically made from a material nonreactive to oxygen and Tl-oxide at high temperatures, such as ceramic alumina. The internal diameter of tube 18 must be sufficient to hold a substrate of a given diameter. Typical substrate materials for Tl-HTS films are $LaAlO_3$, which currently is available in 4-inch disks, $SrTiO_3$, MgO, and other pervskite oxide materials. Furnace 10 must be long enough to have uniform temperature zones for the size substrates being processed. For example, a three inch diameter furnace should be approximately three feet long.

Each end of tube 16 is sealed with a cap that provides a port for communicating a gas to the interior of the tube and, preferably, a second port for positioning items within the tube. For example, as shown in FIG. 1, cap 20 at one end of tube 16 has an inlet 22 for connection to a source of gas and a second opening 24 through which a hollow rod 25 is placed. A thermocouple 26 may be position inside rod 25 within furnace 10 to measure the temperature in zone 12. Similarly, cap 21 at the other end of tube 16 has an inlet 23 for connection to either a vent to maintain total gas pressure at one atmosphere or to a vacuum pump for flushing existing gas out of tube 16 before filling with a specific gas composition. Cap 21 also includes a second opening 27 for another hollow rod 28 and thermocouple 29 to measure the temperature in zone 13. Each cap may be dissassembled at a flange to permit placement of objects within tube 16.

Additional conventional structure is shown in FIG. 1 to hold materials to be heated within each zone. For example, ceramic rod 25 may extend from end cap 20 to a ceramic stage 32 at the interior of zone 12. Similarly, ceramic rod 28 may extend from cap 21 to a ceramic stage 33 at the interior of zone 13. In addition, the position of each rod 25, 28 may be changed to adjust the position of the stages within oven 10.

Tube 18 is quasi-sealed at each end by an associated ceramic plug 36, 37. These plugs serve to confine the heat and gases within the vicinity of the stages in the furnace. In the test apparatus, these plugs consisted of a solid alumina cylinder having an attached alumina tray to form each stage. Each plug was about one inch thick; each tray had a surface area of about 2.5×3 inches.

As is also conventional in this art, the heating coils and quartz tube 16 may be further covered by thermal insulation or reflective mirrors (not shown) for efficiency and safety reasons.

For operation of the embodiment shown in FIG. 1, a conventional Tl-HTS powder or pellet 44, such as Tl-Ba-Ca-Cu-O, is placed in high temperature zone 13 on stage 33 near a substrate, such as a wafer 43, having a precursor film. A rack or other arrangement (not shown) made of ceramic or other material that is unaffected by the environment in furnace 10 may be utilized to hold the wafer 43 and Tl-HTS material 41 on stage 33. The ambient atmosphere is pulled by vacuum pump from port 23, and the oxygen partial pressure in the furnace is adjusted by flowing a mixture of oxygen and a nonreactive gas such as nitrogen or argon, to approximately 1 atmosphere into tube 16 through port 22. Gas can be constantly flowed through tube 16 to maintain its oxygen partial pressure by valving off the vacuum pump and opening the vent to air at port 23. Ambient air can be used as the gas medium within tube 16 simply by flowing no gas through port 22 and opening port 23 to air without prior vacuum pumping of tube 16.

In a manner similar in operation to the prior art crucible method discussed above, under suitable atmospheric conditions within tube 18, when the high temperature zone 13 is heated to its optimal temperature for Tl-HTS film growth, the necessary Tl-oxide partial pressure for film growth is seen to be primarily generated by sublimation from the mixed powder/pellet, and Tl-oxide vapor reacts with the precursor film on the substrate. The optimum temperature varies from more than 775° C. for oxygen partial pressures near 1 atmosphere to more than 550° C. for oxygen partial pressures near 1 mTorr.

However, this embodiment of the invention further includes a supply of Tl-oxide 40 placed in a suitable container on stage 32 in the low temperature zone 12 of furnace 10. When heated to a range between 200° and 25° C. below the temperature of zone 13, this source of Tl-oxide has been found to both provide a secondary source of Tl-oxide for reaction with the precursor film in high temperature zone 13 and replenish the primary source of Tl-oxide for film reaction that sublimates from the mixed powder/pellet in high temperature zone 13. By experimenting, an optimum temperature in low temperature zone 12 may be determined for use with various substrate temperatures and partial pressures in high temperature zone 13.

Figure 2:
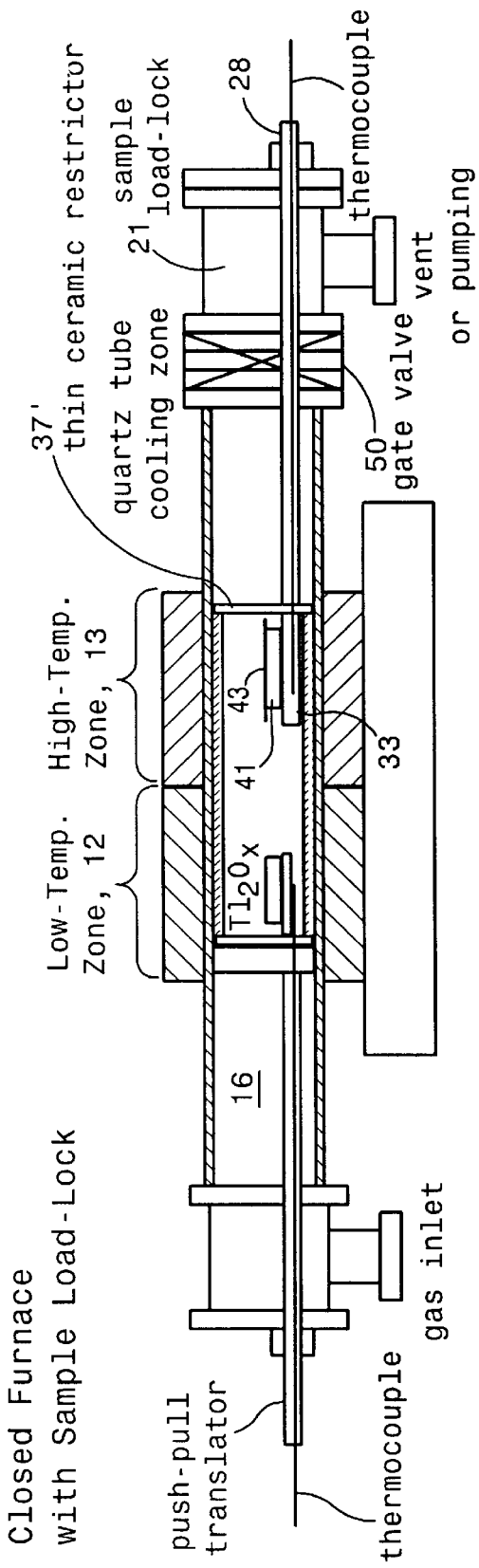
FIG. 2 shows a second embodiment of the invention utilizing a gate to permit removal of the substrate without cooling the furnace.

The embodiment of FIG. 2 shows a system similar to the embodiment of FIG. 1 with the addition of a gate valve 50 adjacent cap 21 of tube 16. In this embodiment, plug 37 may be replace with a thin ceramic disk 37' attached to rod 28. In the operation of this embodiment of the invention, after the wafers are processed in high temperature zone 13 as previously discussed, rod 28 is pulled out until stage 33 is outside heating zone 13 within tube 16. In this region, the sample quickly cools by radiation to safe handling temperatures of below 100° C. The stage is then further pulled by rod 28 to a position within cap 21. Gate value 50 is then closed, maintaining the temperature and atmosphere within tube 16. The flange on cap 21 is then opened to replace the wafers. The process is then reversed to place new wafers back within tube 16 for processing. It is estimated that samples may be run through the embodiment of FIG. 2 every 1–2 hours, as compared with the 6–14 hour cycle time for the embodiment of FIG. 1.

Figure 3:
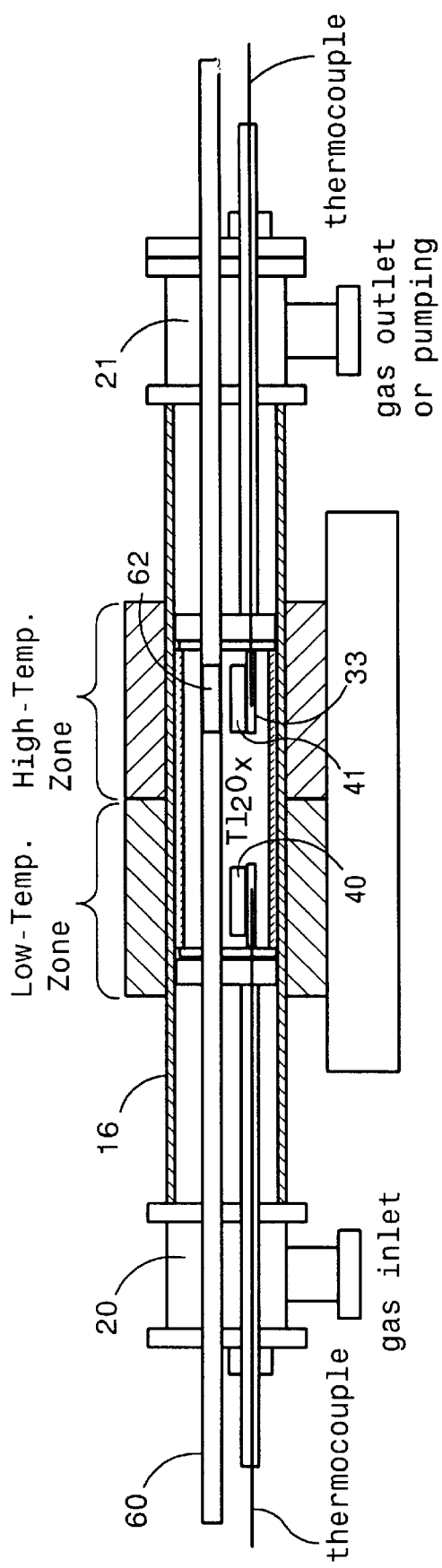
FIG. 3 shows a third embodiment of the invention for processing a continuous length substrate.

FIG. 3 shows a modification of the embodiment of FIG. 1 which permits the growth of Tl-HTS coatings on long lengths of substrate material for the formation of superconducting wires or tapes. Such substrate material coated with a precursor could be fed continuously through this open furnace from one end of the furnace to the other to form a Tl-HTS coating. A ceramic tube 60 having a diameter much less than the diameter of furnace tube 16 extends through furnace from a first end outside end cap 20 to an opposed second end outside end cap 21. Tube 60 has an opening 62 directly above stage 33, which opening 62 may be either a break in tube 60 or hole(s) in tube 60. The precursor coated substrate material (not shown) may feed through tube 60 from a reel (not shown) at one end of tube 60 to a second reel (not shown) at the other end.

A test of this invention for thin film growth of Tl-2212 superconducting phase was made using the closed furnace of FIG. 1. Tl-free precursor oxide films with 0212 composition ~500 nm thick were deposited onto $LaAlO_3$ (100) substrates by off-axis rf sputtering (base pressure $\sim 1 \times 10^{-7}$ Torr). Two-inch wafers were introduced into the sputtering system and slowly rotated during deposition. Total pressure in the chamber during deposition was 10 mTorr and the flowing gas mixture was $Ar:O_2 = 90\%:10\%$. Two inch diameter oxide sputter targets are used. Thickness and compositional uniformity within ±2% were attained over a 3-inch diameter.

Tests have shown that use of compositional sputtering targets always results in Ba-rich films, therefore, material from an 0212 compositional target was co-sputtered along with material from both Ca-oxide and Cu-oxide targets. Rutherford backscattering spectrometry was used to determine the actual film composition with ±1% accuracy. Only precursors within ±5% of the desired 0212 composition were used for these thallination studies.

The precursor films were placed on an alumina holder directly above the TlBaCaCuO mixed powder in the high-temperature section 13 of the closed two-zone furnace. $Tl_2O_3$ powder was placed in the low-temperature zone 12 of the furnace. All films were grown in air at 800° C. for 30 minutes. Other temperatures, process times and ambients can also be used.

In one test, 30.771 grams of Tl:Ba:Ca:Cu-oxide powder with a starting cation composition of 3:2:1:4 was used in the high-temperature zone of the furnace as the primary source of Tl-oxide for the thin film thallination process. The precise starting composition of the Ba:Ca:Cu-oxides is not particularly important; for any given starting composition, the appropriate Tl-content can be found to grow high-quality films. As this mixed powder is used in successive thin film growth runs in the furnace, any changes in weight are the result of changes in the only volatile component: Tl-oxide. By weighing this powder before and after every run, the average Tl-content in the powder can be determined for each run. To prevent the loss of Tl-oxide from the mixed powder, a second source of $Tl_2O_3$ powder is placed in the low-temperature zone of the furnace. This temperature is adjusted for each run to compensate for excessive loss or gain of Tl-oxide in the mixed powder.

The furnace-processed films are characterized by several methods. Material phase(s) are determined using x-ray diffraction (XRD) $\theta$-$2\theta$ scans from Cu $K_\alpha$ radiation. Optical and scanning electron microscopies are used to determine film morphology, lateral uniformity, and post-thallinated film thickness. A commercial SQUID magnetometer is used to measure the Meissner transition ($T_c$) in a magnetic field of 0.2 mT and to determine the critical current density ($J_{cm}$) at 5° K. and 80° K. in a low field applied perpendicular to the plane of the film.

The first growth runs using the starting powders resulted in films that were a mixed phase of Tl-2212 and Tl-rich oxides. When the weight of the starting powder dropped to <30 g, Tl-2212 phase-pure films were produced. XRD shows these films to be phase-pure and highly c-axis oriented. Microscopy (optical and scanning electron) shows that the films are smooth and homogeneous. Cross-sectional scanning electron microscopy finds that the film thickness increases to ~600 nm following thallination.

The best Tl-2212 films grew when the weight of the mixed TlBaCaCuO powder was 29.5±0.15 g, which corresponds to a nominal cation composition of 2.76:2.00:1.00:4.00. The temperature of the secondary $Tl_2O_3$ source was adjusted from run-to-run between 745° and 755° C. to maintain the correct Tl-content in the mixed powder. The inventors subsequently realized that the need to adjust the low temperature zone of the furnace following each run was due to problems with temperature uniformity caused by a malfunctioning heating coil in the furnace.

Table I contains the results of consecutive growth runs (from 600 nm thick films) demonstrating that the Tl-content of the mixed powder can be controlled using the secondary source. All of these films have high critical current density and the same superconducting Meissner transition temperature.

TABLE I

Properties of Tl-2212 films all grown at 800° C. in air.

| Sample No. | TlBaCaCuO wt [grams] | $J_{cm}(T = 5K)$ [A/cm$^2$] | $J_{cm}(T = 80K)$ [A/cm$^2$] | $T_c$ (K) |
|---|---|---|---|---|
| CF-3-6-97-2 | 29.628 | $9.2 \times 10^6$ A/cm$^2$ | | 101 |
| CF-3-7-97-1a | 29.575 | $1.0 \times 10^7$ A/cm2 | $1.3 \times 10^5$ A/cm$^2$ | 102 |
| CF-3-11-97-1 | 29.556 | $1.0 \times 10^7$ A/cm2 | $1.5 \times 10^5$ A/cm2 | 102 |
| CF-3-12-97-1 | 29.540 | $1.1 \times 10^7$ A/cm2 | $1.2 \times 10^5$ A/cm2 | 102 |
| CF-3-17-97-1 | 29.541 | $9.2 \times 10^6$ A/cm2 | $8.3 \times 10^4$ A/cm2 | |

TABLE I-continued

Properties of Tl-2212 films all grown at 800° C. in air.

| Sample No. | TlBaCaCuO wt [grams] | $J_{cm}(T = 5K)$ [A/cm$^2$] | $J_{cm}(T = 80K)$ [A/cm$^2$] | $T_c$ (K) |
|---|---|---|---|---|
| CF-3-18-97-1 | 29.510 | | 1.2 × 10$^5$ A/cm2 | |
| CF-3-19-97-1 | 29.499 | | 1.2 × 10$^5$ A/cm2 | |
| CF-3-20-97-1 | 29.500 | | 1.7 × 10$^5$ A/cm2 | |
| CF-3-24-97-1 | 29.479 | | 1.7 × 10$^5$ A/cm2 | |
| CF-3-26-97-1 | 29.474 | | 1.5 × 10$^5$ A/cm2 | |
| CF-3-26-97-2 | 29.487 | | 1.4 × 10$^5$ A/cm2 | |
| CF-3-27-97-1 | 29.445 | 9.2 × 10$^6$ A/cm2 | 1.8 × 10$^5$ A/cm2 | 102 |
| CF-3-28-97-1 | 29.412 | | 1.2 × 10$^5$ A/cm2 | |
| CF-3-31-97-1 | 29.355 | | 1.4 × 10$^5$ A/cm2 | |
| CF-4-4-97-1 | 29.337 | | 1.3 × 10$^5$ A/cm2 | |
| CF-4-9-97-1 | 29.358 | 9.2 × 10$^6$ A/cm2 | | 102 |
| CF-4-9-97-2a | 29.380 | 9.9 × 10$^6$ A/cm2 | | |
| CF-4-10-97-1b | 29.394 | 9.3 × 10$^6$ A/cm2 | | 102 |
| CF-4-11-97-1b | 29.387 | 9.3 × 10$^6$ A/cm2 | | |
| CF-4-11-97-1e | 29.387 | 1.1 × 10$^6$ A/cm2 | | |

It is important that no Tl$_2$O$_3$ powder was added to the furnace system during the course of these runs. The Tl-content of the mixed powder was maintained strictly by transferring Tl-oxide from the secondary Tl$_2$O$_3$ source 40 to the mixed powder source at 41 during the course of each growth runs. After a large enough number of runs, Tl$_2$O$_3$ powder will need to be added to the secondary source, however, the amount is not critical. Sufficient powder is added simply by refilling the container.

This invention is intended for use with any of the family of Tl-HTS materials. Although thallium, barium, calcium, copper, and oxygen are the basic building blocks of this material system, as is known to those skilled in the art, there are a variety of substitutions and dopants that can be used to form Tl-HTS materials. For example: lead can partially substitute for thallium, strontium can substitute for barium, and yttrium can dope the calcium sites. In two known superconductors, calcium is not used. Other combinations of material have been used with varying degrees of success.

Any combination of materials which includes volatile elements such as thallium and mercury and which form a high temperature superconductor, and which is capable of being sublimated in the manner described and claimed herein, is intended to be within the class of VE-HTS as used herein. The mixed powder or pellet that serves as the primary source of VE-oxide may also consist of any of the various multi-elemental VE-containing compounds. It is intended that the scope of the invention be defined by the claims appended hereto.

We claim:

1. A method for converting a nonsuperconducting precursor into a volatile element (VE)-high temperature superconducting (HTS) layer on a substrate in a furnace, said method comprising:

heating a substrate including a precursor and adjacent first source of VE-HTS material at a high temperature, wherein VE-oxide sublimates from the source to the precursor; and heating a secondary source of VE-oxide at a lower temperature than the high temperature, wherein VE-oxide from said secondary source replenishes the VE in the first source.

2. The method of claim 1 wherein said VE-HTS material consists of a Tl-Ba-Ca-Cu-O mixture.

3. The method of claim 1 wherein the two heating steps are performed simultaneously in a multiple zone furnace.

4. The method of claim 3 wherein the higher temperature is from about 25° C. to 200° C. higher than the lower temperature.

5. The method of claim 4 wherein the higher temperature in said furnace varies from greater than 775° C. for an oxygen partial pressure of about one atmosphere to greater than 550° C. for an oxygen partial pressure of about 1 mTorr.

6. The method of claim 5 wherein said atmosphere comprises oxygen and an unreactive gas.

7. A method for converting a nonsuperconducting precursor on a substrate into a Tl-HTS layer in a multiple zone furnace having an elongate tube, said method comprising:

heating in one zone of the furnace and within the tube, the substrate and adjacent first source of Tl-HTS material at a high temperature, wherein Tl-oxide sublimates from the source to the precursor;

heating at lower temperature than the high temperature, in a separate zone of the furnace and within the tube, a second source of Tl-oxide, wherein Tl-oxide from said second source replenishes the Tl-oxide in the first source;

moving the substrate from the one zone to an adjacent cooling zone;

sealing the interior of the tube from the substrate; and removing the substrate from the furnace.

8. The method of claim 7 wherein said Tl-HTS material consists of a Tl-Ba-Ca-Cu-O mixture.

9. The method of claim 7 wherein the two heating steps are performed simultaneously.

10. The method of claim 7 wherein the higher temperature in said furnace varies from greater than 775° C. for an oxygen partial pressure of about one atmosphere to greater than 550° C. for an oxygen partial pressure of about 1 mTorr.

11. The method of claim 7 comprising the additional step of allowing the substrate to cool to about 100° C. after the substrate is moved from the one zone and before it is moved to the adjacent end.

* * * * *